United States Patent
Buckles et al.

(10) Patent No.: US 6,756,874 B2
(45) Date of Patent: Jun. 29, 2004

(54) SERIES TRANSMISSION LINE TRANSFORMER

(75) Inventors: Robert A. Buckles, Livermore, CA (US); Rex Booth, Livermore, CA (US); Boris T. Yen, El Cerrito, CA (US)

(73) Assignee: Bechtel Nevada Corporation, Las Vegas, NV (US)

( * ) Notice: Subject to any disclaimer, the term of this patent is extended or adjusted under 35 U.S.C. 154(b) by 418 days.

(21) Appl. No.: 09/814,286

(22) Filed: Mar. 21, 2001

(65) Prior Publication Data

US 2001/0054947 A1 Dec. 27, 2001

Related U.S. Application Data

(60) Provisional application No. 60/191,006, filed on Mar. 21, 2000.

(51) Int. Cl.[7] .................................................. H01F 27/28
(52) U.S. Cl. ............................................ 336/180; 333/32
(58) Field of Search ........................ 336/170, 180–184, 336/220–222; 333/32–35

(56) References Cited

U.S. PATENT DOCUMENTS

| 3,882,432 | A | * | 5/1975 | Bowman et al. | 333/32 |
| 4,839,616 | A | * | 6/1989 | Herzog | 333/32 |
| 5,220,297 | A | * | 6/1993 | Crowhurst | 333/32 |
| 6,337,608 | B1 | * | 1/2002 | McLean et al. | 333/35 |

* cited by examiner

Primary Examiner—Tuyen T. Nguyen
(74) Attorney, Agent, or Firm—Philip J. Anderson; Anderson & Morishita, LLC

(57) ABSTRACT

A series transmission line transformer is set forth which includes two or more of impedance matched sets of at least two transmissions lines such as shielded cables, connected in parallel at one end ans series at the other in a cascading fashion. The cables are wound about a magnetic core. The series transmission line transformer (STLT) which can provide for higher impedance ratios and bandwidths, which is scalable, and which is of simpler design and construction.

7 Claims, 5 Drawing Sheets

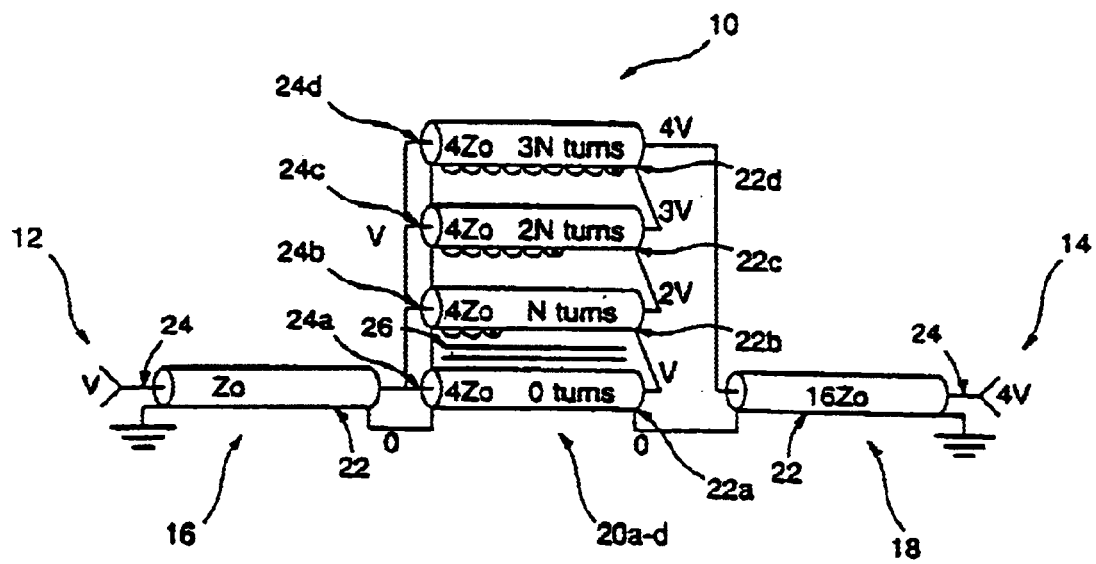
Figure 1. 16:1 TLT of the prior art
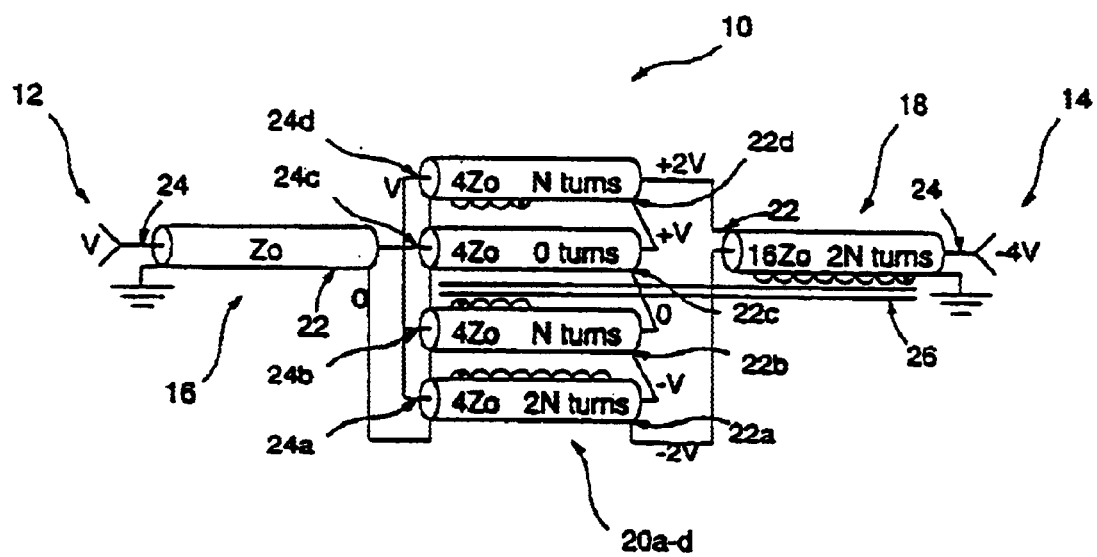
Figure 2. 16:1 Inverting Balanced TLT of prior art.

A.

B

A

B

SERIES TRANSMISSION LINE TRANSFORMER

CROSS-REFERENCE TO RELATED APPLICATION

The present invention is a continuation of a prior filed provisional patent application Serial No. 60/191,006 filed Mar. 21, 2000 and titled "Series Line Transmission Transformer."

GOVERNMENT LICENSE RIGHTS

The U.S. Government has a paid-up license in this invention and the right in limited circumstances to require the patent owner to license others on reasonable terms as provided for by the terms of DOE-AC08-96NV11718 awarded by the United States Department of Energy.

FIELD OF THE INVENTION

The present invention relates to transmission line transformers.

BACKGROUND

The term "Transmission Line Transformer" ("TLT") has come to mean various things over the past century. Some believe of it as a fabrication of select lumped LC elements while others see it generally as a filter network and still other see it as variations of the type of wire-wound transformer. Baluns, ununs and Blumleins are typical incarnations of a TLT. Regardless of the means, (i.e. lumped elements, wire or bonafide transmission line) the aim is always the same—to match impedance.

Impedance matching is important to prevent signal reflections which, at high frequencies and/or fast rise times, can produce false logic and data signals.

Prior TLT's have required ferrite cores for coupling inductance such as described in Mourant, U.S. Pat. No. 5,886,589, and Hansen et al U.S. Pat. No. 4,488,136, the disclosures of which are hereby incorporated by reference.

A drawback with these types of TLT's is that the ferrite forms part of the signal transmission path and hence the transformers are not as efficient as they should be due to parasitic inductive and capacitance losses. In Van Dine, U.S. Pat. No. 3,673,529 there is disclosed an impedance matching transformer for transmission lines which also relies on inductance. Furthermore, where usual TLTs are used, the number of conductors and complexity of the windings has limited impedance ratios to small values, e.g. 1:1 to 4:1 Baluns, Ununs and Blumleins.

Transmission line transformers are thus known. A general class of transmission line transformer which claims higher ratios, known as a Guanella Transformer, has an impedance ratio equal to $n^2$, where n is the number of lines. A 16:1 example is illustrated in FIG. 1. The winding complexity and length of transmission line required for such transformers limits their construction to at most a few lines and low ratio. It is for this reason that baluns, ununs and other low impedance ratio TLTs have been limited to ratios of 4:1 or less.

Prior transmission line transformers have suffered from several other drawbacks. These drawbacks include high losses and low efficiency, narrow bandwidth, low operating frequency, limited impedance ratio, limited scalability and modularity. They are not conducive to mixing different types of transmission lines, and they are not well-suited to production methods or miniaturization.

There is a need for a transformer which can overcome the drawbacks noted above including reduction of parasitic losses, thereby increasing efficiency, operating frequency, bandwidths and impedance ratios.

SUMMARY OF THE INVENTION

There is, therefore, set forth according to the present invention a Series Transmission Line Transformer (STLT) which can provide for higher impedance ratios and bandwidths, which is scalable, and which is of simpler design and construction.

Accordingly a series transmission line transformer is set forth having input and output connections with a desired impedance relationship, voltage, and bandwidth. A first set of at least two transmission lines of equal length are connected together. Preferably, no more than three lines are used. Preferably, the lines have the same impedance, and preferably, they are all connected together in parallel on one end and in series on the other end. As such, a signal sent into the parallel ends will sum together (step up) on the series end, while a signal sent into the series end will step down at the parallel end. Preferably the lines are oppositely coiled about a closed core of magnetic material. Preferably the material is some formulation of soft ferrite. A second set of at least two transmission lines with the same caveats as stated above is attached to the first set of transmission lines. The junction between the two sets must be impedance matched. Preferably, the second and first sets have the same step up or step down polarity. (Exotic designs might not follow this scheme.) Preferably, the second set of lines are oppositely coiled about the same core as the first set. Furthermore, it must have the same volts per turn (common to a line, not differential) and flux orientation determined by helicity and voltage polarity. When a core is not used or required in this fashion (for strictly high frequency, narrow bandwidth), preferably individual cores or beads are threaded on each series-connected transmission line. Subsequent sets are attached in a chain or "Series" of sets to obtain the desired impedance ratio, hence "Series Transmission Line Transformer". Taken as a whole, the STLT performs much better than a chain of separate individual TLTs.

It has been found that the foregoing construction of connected sets in series and coiled about a common magnetic core, can provide a wide range of impedance ratios, (e.g from 4:1 to 1024:1) with relatively simple construction. Bandwidth, efficiency, fidelity and impedance ratio are mutually enhanced while keeping the STLT relatively simple. Only set pairs (or trios) of lines are used and sets are connected in series rather than individual lines.

BRIEF DESCRIPTION OF THE DRAWINGS

These and other features and advantages will become better appreciated as the same becomes better understood with reference to the specification, claims and drawings wherein:

FIG. 1 shows a schematic of a 16:1 transmission line transformer (TLT) according to the prior art;

FIG. 2 shows a schematic of the same 16:1 TLT, but with some slight modifications, according to the prior art.

DESCRIPTION

Figure 3:
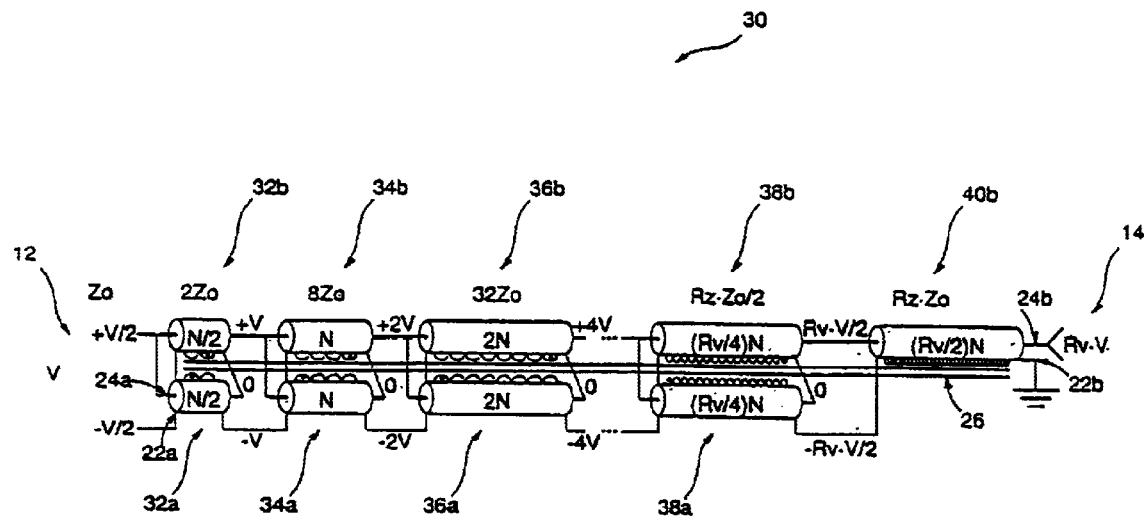
FIG. 3 is a generalized schematic showing the construction of an arbitrary ratio Series Transmission Line Transformer (STLT) according to the present invention.

TLT's are often referred to as "impedance matchers" or "Z matchers". Coaxial cable is illustrated as a standard electrical symbol, but any type of transmission line will serve the same function (e.g. twisted pair, micro-strip, semi-rigid micro-coax). However, the preferred type of transmission line should suit the application, as is known in the art. We will henceforth refer to transmission lines as cables. Either end of a TLT may be the input or output, so we will refer to the "low end" or "high end". Labeled voltage V, impedance Zo, and number of turns are completely general, however, each figure is put on equal footing for comparison.

Where "turns" are shown, an inductor electrical symbol is shown on the cable, implying the cable is coiled with the indicated number of turns and field polarity. The helicity of all turns in the drawings is assumed uniform. If a single rod is used instead of a closed core, then coils of opposite electrical polarity must be wound with opposite helicity to achieve the same field polarity, as is known in the art. A core of magnetic material is referred to with a standard electrical symbol. The exact size, shape, and formulation should suit the application, as is known in the art.

Turning to the drawings, FIG. 1 shows a transmission line transformer 10 (TLT) according to the prior art for an impedance ratio of 16:1. The TLT 10 has at the low end 12 and high end 14, coaxial cables 16 and 18 respectively. (Although typically used in practice, cables 16 and 18 are not strictly required, and may equivalently be replaced by the source and load.) The set of four cables 20*a-d* are of equal length, and perform all of the TLT function. Each cable has a "shield" conductor 22, and a "center" conductor 24. At both the low end 12 and high end 14, the shield conductors 22 of cables 16 and 18 are connected to ground.

At the low end of cables 20*a-d*, a "parallel" connection is made. The impedance of cable 16 must match the parallel impedance of cables 20*a-d*. All shield conductors 22*a-d* are connected to the grounded shield conductor 22 of cable 16, and the center conductors 24*a-d* are all connected to center conductor 24 of cable 16.

At the high end of cables 20*a-d*, a "series" connection is made. Only shield conductor 22*a* is connected to the grounded shield conductor 22 of cable 18, and only center conductor 24*d* is connected to center conductor 24 of cable 18. Shield and center conductors 22*a-c* and 24*b-d* are connected as follows: 24*a* to 22*b*, 24*b* to 22*c*, 24*c* to 22*d*.

Each of the cables 20*b-d* is coiled about the core 26 as set forth in FIG. 1. Each loop or turn of cable will have the same voltage drop Vt across it, since the field in the core is common to all loops, as should be known to those skilled in the art. This voltage is a design factor, chosen for the application requirements and core selection, as should be known to those skilled in the art. Cable 20*b* is coiled 8N turns (N=V/Vt, an integer); cable 20*c* is coiled 2N turns; and cable 20*d* is coiled 3N turns. Cable 20*a* is not coiled at all since it is everywhere uniform in voltage.

FIG. 2 shows another TLT 28 of according to the prior art, to demonstrate modifications which reduce capacitive energy losses, as well as how a TLT can be made inverting. It is identical to TLT 10 of FIG. 1 in all respects except as follows. The voltages are balanced positive and negative within the TLT by changing how the cables are wound on the core, as shown in FIG. 2. The total number of windings is unchanged, however, cable 18 must be wound on the core. It is now an integral part of the TLT 10. TLT 10 is also configured for inverting operation. The connections to the high impedance cable 18, are reversed, with shield conductor 22 connected to center conductor 24*d*, and center conductor 24 connected to shield conductor 22*a*. This is allowed electrically by winding cable 18 on the core. Note that TLT 10 can be switched back to non-inverting simply by reversing the connections of cable 18 just described. However the windings are still required, and the helicity must be reversed as well. Cable 18 can be removed from the TLT without affecting performance if the source/load 14 is driven differentially.

To produce higher level impedance ratios for TLTs 10 according to the prior art, the number of lines connected in this parallel fashion must increase; all the cable lengths must increase; and the number of core turns must increase geometrically. The required number of total core turns, T, can be expressed as $T = N \cdot Rv \cdot (Rv-1)/2$, where Rv is the voltage ratio. (e.g. TLT 10 has Rv=4 and T=6·N.) In the limit of large Rv, T is proportional to $Rv^2$, or Rz, the impedance ratio. This is a general result of the TLTs of prior art, regardless of the details of various configurations. Thus it has been found that the TLTs 10, according to the prior art, suffer from physical constraints for coiling and connecting numerous cables depending upon the ratio sought. Even for the TLTs 10, there is a single series connection involving 5 cables, which is a difficult task. Among other drawbacks, these TLTs according to the prior art tend to be less efficient, are not suitable for very wide bandwidths, cannot be simply scaled and are not conducive to mixing different types of transmission lines.

Turning to FIG. 3 a generalized series transmission line transformer (STLT) 30, with impedance ratio Rz, according to the present invention, is set forth. Unlike the prior art, the cables 32*a-b* through 40*b* have unequal lengths. They need be only as long as required to make the appropriate turns on the core 26 (no wasted cable length). They are also of different impedances, with the cable impedance for each section as indicated in FIG. 3.

The STLT has a modular construction. Each cable has a "shield" conductor 22, and a "center" conductor 24. Cables 32*a-b* form one section of the STLT 30 and have an impedance transform of 4:1. On the low end 12, a "parallel" connection is made, conductors shield 22*a-b* are connected to each other, as are center conductors 24*a-b*. Toward the high end of cables 32*a-b*, a series connection is made, with center conductor 24*a* connected to shield conductor 22*b*. Shield and center conductors 22*a* and 24*b* connect to the next section. Likewise, cables 34*a-b* form another section of STLT 30, and have an impedance transform of 4:1. The high end of section of cables 32*a-b* connects to the low end of section of cables 34*a-b*, and so on down the "series" of sections until the desired total impedance ratio Rz is obtained. Each section of TLT 30 is impedance matched to each other.

The cables are wound on the magnetic core 26 with helicity and polarity as shown in the FIG. 3. The "a" cables are all of the same polarity and helicity, and are shown on the bottom side of the core 26 in FIG. 3. The "b" cables have opposite polarity and helicity to the "a" cables and are shown on the top side of the core 26 in FIG. 3. All voltages are balanced differentially with respect to ground. The low end 12 is left open to demonstrate (below in further Figs.) how this connection affects (or rather leaves unaffected) this general design. It could be driven as-is with a differential source/load, and has impedance Zo and voltage V, just as in the prior art FIGS. 1–2. The turns factor N(=V/Vt) is likewise chosen to be the same. For the purpose of comparison, this puts the STLT 30 design on equal footing with the prior art TLTs 10. The high end 14 has impedance Rz·Zo and voltage Rv·V, where Rz and Rv are the design voltage and impedance ratios (Rz=Rv$^2$). High end 14 is shown with cable 40b since this cable is typically included on the core. Like the low end 12, it may be left out if the source/load is driven differentially.

A profound characteristic of the STLT 30 versus the prior art TLT's 10, is how the number of cables and total required turns scale with impedance ratio (Rz) and voltage ratio, Rv. Ignoring cables 18 and 40b (and 16, which do not affect these ratios), we see that for the prior art, the impedance ratio scales as n$^2$, a quadratic function, (n=number of cables performing the impedance transform) where for the STLT 30, it scales as 2$^n$. This exponential function is much steeper which means fewer cables are required in the STLT 30 for the same impedance ratio as prior art. The total number of turns required for these n cables scales as Rv·(Rv−1) for prior art, (linearly with impedance ratio) but only Rv−1 (linearly with voltage ratio) for the STLT 30. This dramatic savings in required cables, and number of turns (cable length) make the STLT 30 according to the present invention a much improved technology over prior art.

Figure 4:
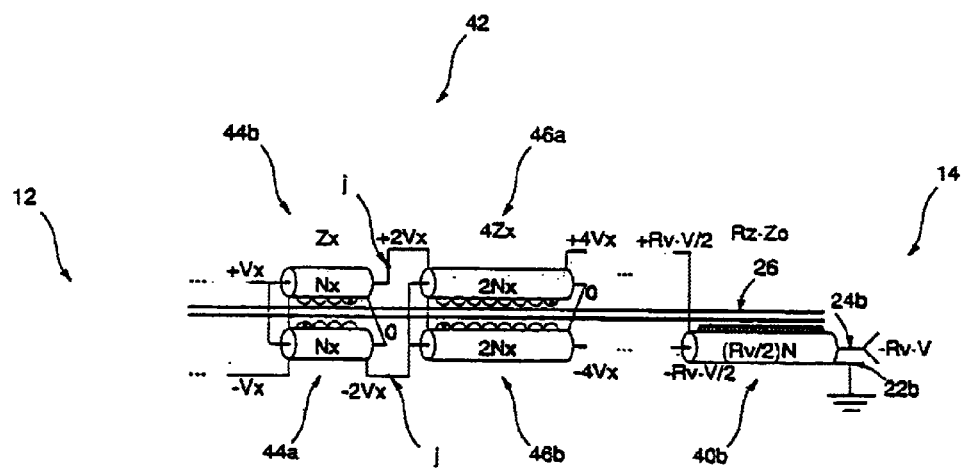
FIG. 4 shows a simple modification to the STLT of FIG. 3 showing how a simple connection reversal accomplishes a signal inversion.

Continuing with FIG. 4 it is seen how a signal inversion is easily accomplished. Cables 44a-b and 46a-b represent any two sections of STLT 30 described above. The inversion is obtained by swapping connections j as indicated. This actions reverses the polarity of the windings and hence the field for the entire remainder of the STLT 30. This problem is solved by completely flipping (exchanging) the position of all cables "a" with "b" to the right junction j, restoring the proper polarity. The STLT 30 is literally inverted. This feature of inversion is preferably accomplished at the high end 14, by only inverting cable 40b which returns the signal to a single-ended (grounded shield conductor 22) operation.

Figure 5A:
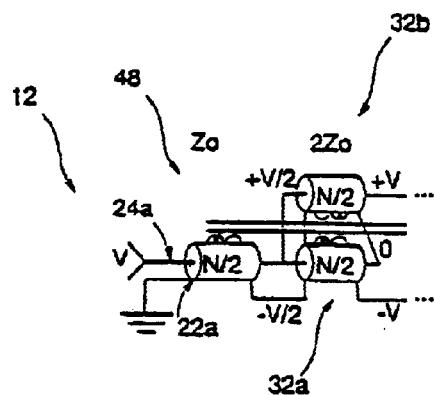
FIGS. 5A and 5B are diagrams for a single-ended termination of the STLT low impedance end for a completely balanced, shortest length and for least turns.
Figure 5B:
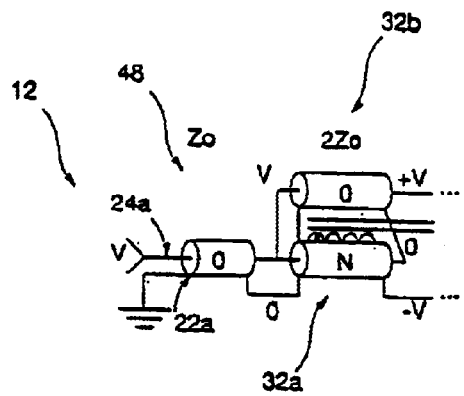

Finally, in FIGS. 5A and B, two simple schemes for single-ended termination of a STLT 30 low impedance end 12 which leaves the rest of the STLT 30 unchanged: The STLT 30 of FIG. 5A maintains shortest length with completely balanced cables 32a-b at the expense of N/2 more turns on cable 48. FIG. 5B makes the first section (cables 32a, b)(only) unbalanced at the expense of cable length, but doesn't require any more turns. In fact cable 48 is not strictly needed and may equivalently be replaced with the source/load 12.

In some applications, either of these simple terminations of the low end 12 is the best choice. However, from FIGS. 3–5, one may notice that the shield conductors 22 all have negative voltages. For the special case of tightly closed transmission lines, like coaxial cable, most of the stray capacitive energy is from the shield conductors to ground (e.g. the core 26). Since the shield conductors 22 are all uni-polar, and capacitive energy is voltage-squared, it implies this energy can be reduced by making the shield conductors 22 equally bi-polar. The ideal case is a reduction of half the stray capacitive energy. Furthermore, one should try to reduce the total required turns on cable 40b since energy is being lost in driving the core 26. The simple termination schemes presented in FIGS. 5A and B can be used in a more exotic fashion to accomplish both these aims.

Figure 6A:
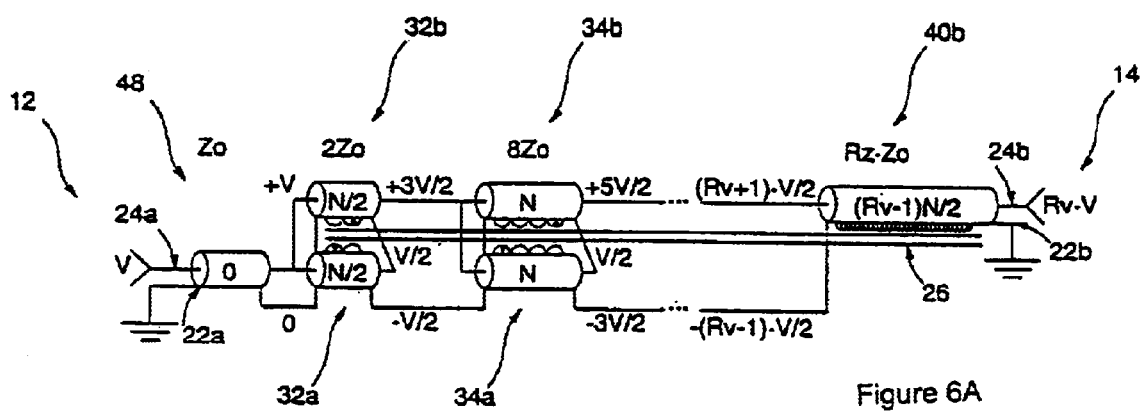
FIGS. 6A and 6B are diagrams extending simple termination schemes in FIGS. 5A and B to unbalance the STLT, reduce capacitive energy losses and reduce total turns.
Figure 6B:
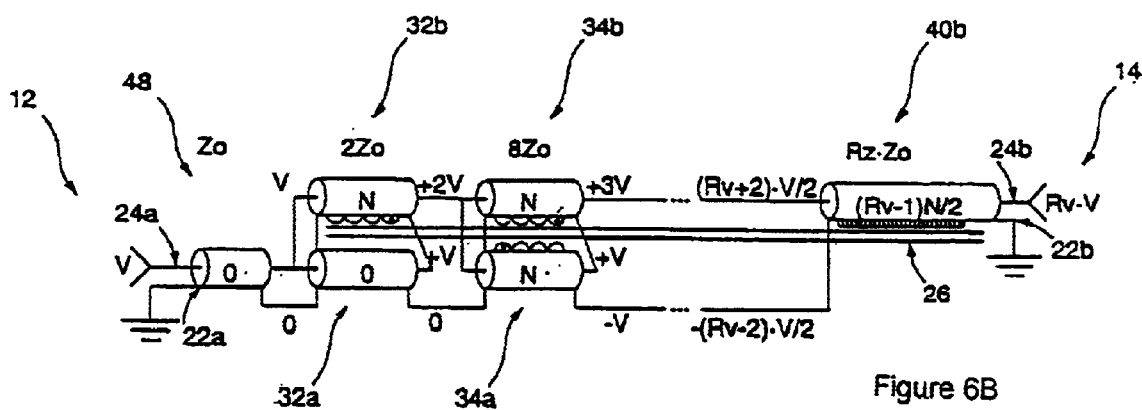

We illustrate such a method in FIGS. 6A and B for a non-inverting configuration. The goal is to raise the common voltage throughout the STLT 30 to a more balanced shield conductor 22 voltage without seriously impacting the design. In FIG. 6A, shield conductor 22a is grounded at the low end 12 through the optional cable 48. This establishes an offset of +V/2 throughout the STLT 30, and requires N/2 less turns on cable 40b. In FIG. 6B, we proceed one step further by also grounding conductor 22a of cable 34a by moving its turns over to cable 34b (cable length has to increase). This provides another level shift of +V/2 and N/2 less turns on cable 40b. One may proceed further in this fashion to increase the level shift and reduce turns at cable 40b until the total turns on shield conductors 22 are in an optimal voltage balance positive and negative, or rather the capacitive energy is minimal. At some point however, the capacitive energy from center conductors 24 (at the junctions) will begin to offset this savings, so the proper optimization cannot be determined from theory. Proper optimization of STLT 30 can be predetermined in practice by biasing the core 26 with voltage Vc (not shown) while driving the STLT 30 until performance is optimized. The optimal bias is the voltage level shift one should try to obtain with the grounded core 26.

Since this optimization tends to detract from the symmetry and simplicity of FIG. 3, and makes every design unique (not really conducive to large scale production), the preferred low end 12 termination is as shown in FIG. 6A. The simple ground (with optional cable 48) leaves the STLT 30 essentially unchanged. A slight optimization comes for free, with a level shift of V/2 and N/2 less turns on cable 40b. The total required number of turns for this configuration is precisely 3N(Rv−1)/2.

Figure 7:
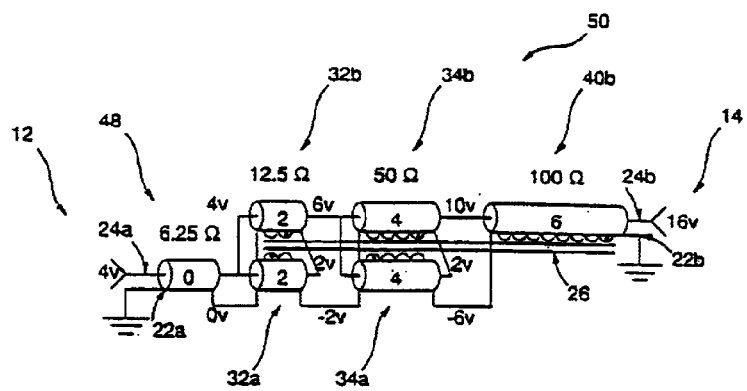
FIG. 7 is a diagram for a non-inverting 16:1 STLT according to the present invention.

Turning to FIG. 7, the invention is embodied as a 16:1 impedance ratio (Rz=16, Rv=4) non-inverting series transmission line transformer (STLT) 50, with Vt=1 volt/turn (N=4), and termination 6A (offset of 2 volts, and 2 less turns on cable 40b). The STLT 50 includes a closed ferrite core 26, a low end 12 of +4 volts and high end 14 of +16 volts, preferably embodied as coaxial cables and/or micro-strip with a center conductor 22 and shield conductor 24.

Cable 48 is a 6.25 ohm transmission line with zero turns, representing the low impedance and is not strictly required. Each of the cables 32a-b is a 12.5 ohm transmission line, and is coiled 2 turns around opposite legs of core 26 as shown. Likewise, each of the cables 34a-b, is a 50 Ohm transmission line, and is coiled with 4 turns about opposite legs of the core 26. The cable 40b is a 100 Ohm transmission line which is coiled −6 turns around the core 26 as indicated. All cables as indicated have the same helicity.

For large STLTs, preferably each of the transmission lines, as stated above, is a solid-jacket, low loss, semi-rigid coaxial transmission line. Preferably the lines are coiled with a generous bending radius and subsequently assembled on the core 26, but they may be would directly on the core 26. Further, concerning the core 26, a pair of soft ferrite cores with circular cross-section and long rectangular windows 42 are preferred as opposed to toroids or cores with rectangular cross section.

Figure 8:
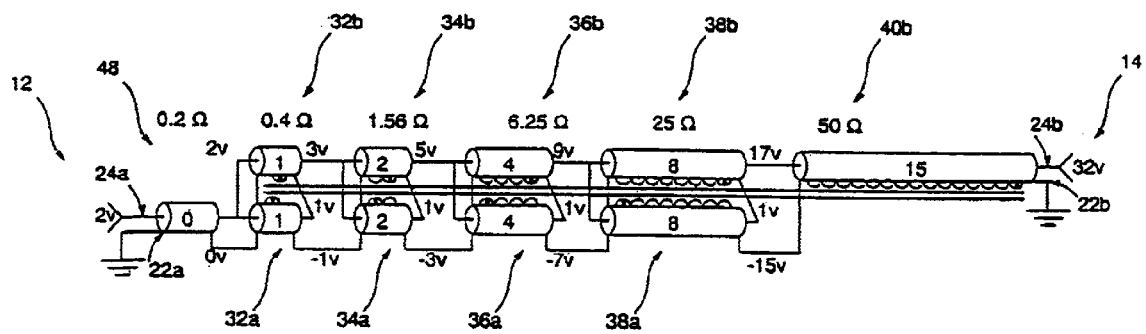
FIG. 8. is a diagram similar to FIG. 7 for a 256:1 STLT.

FIG. 8 shows a 256:1 impedance ratio embodiment of the invention with Zo=50/256 ohms, V=2 volts, Vt=1 volt/turn, N=1.

Figure 9:
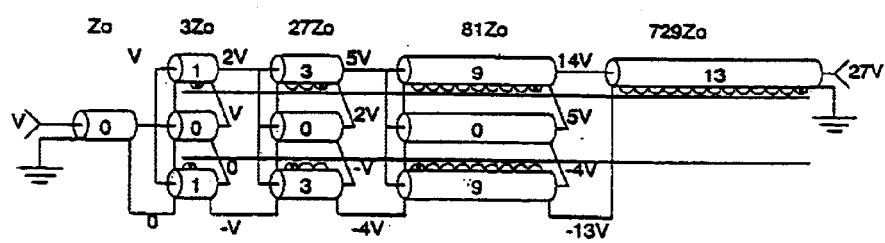
FIG. 9 is a generalized diagram for a 729:1, non-inverting STLT.

FIG. 9 shows a generalized 729:1 impedance ratio embodiment, this one made with three cables per section, resulting in an even more dramatic impedance transform. The analysis is exactly identical to the above since the middle row of cables doesn't have to be wound on the core. The only difference here is that impedance ratio scales as $3^n$, where n is the number of cables performing the function (9 in this case). The total required number of turns is still the same: T=3N(Rv−1)/2, which is 39N for this case.

The arrangement of the STLT 30 described above has been found to provide the following benefits. First, from a construction standpoint, the use of cable pairs (and/or trios) connected in a series chain provides for a more simple device in that fewer connections are required and fewer transmission lines are involved than is required for TLTs according to the prior art particularly where large impedance ratios are required. Further the STLT 30 is scalable in size and power requirements, finding application from microcircuits to high power output. A printed circuit board (PCB) STLT 30 can be easily made with techniques known in the art. A continuous flexible circuit can be wound on a core, or printed on rigid laminates tied with vias and threaded with a core or layers of magnetic material. For a micro-circuit STLT, a printed strip or micro-strip wiring implemented with microwave techniques known in the art can be clamped between plates of ferrite. Still further, the lines could be chemically deposited on a sintered ferrite or other magnetic material substrate using photolithography processes.

Figure 10:
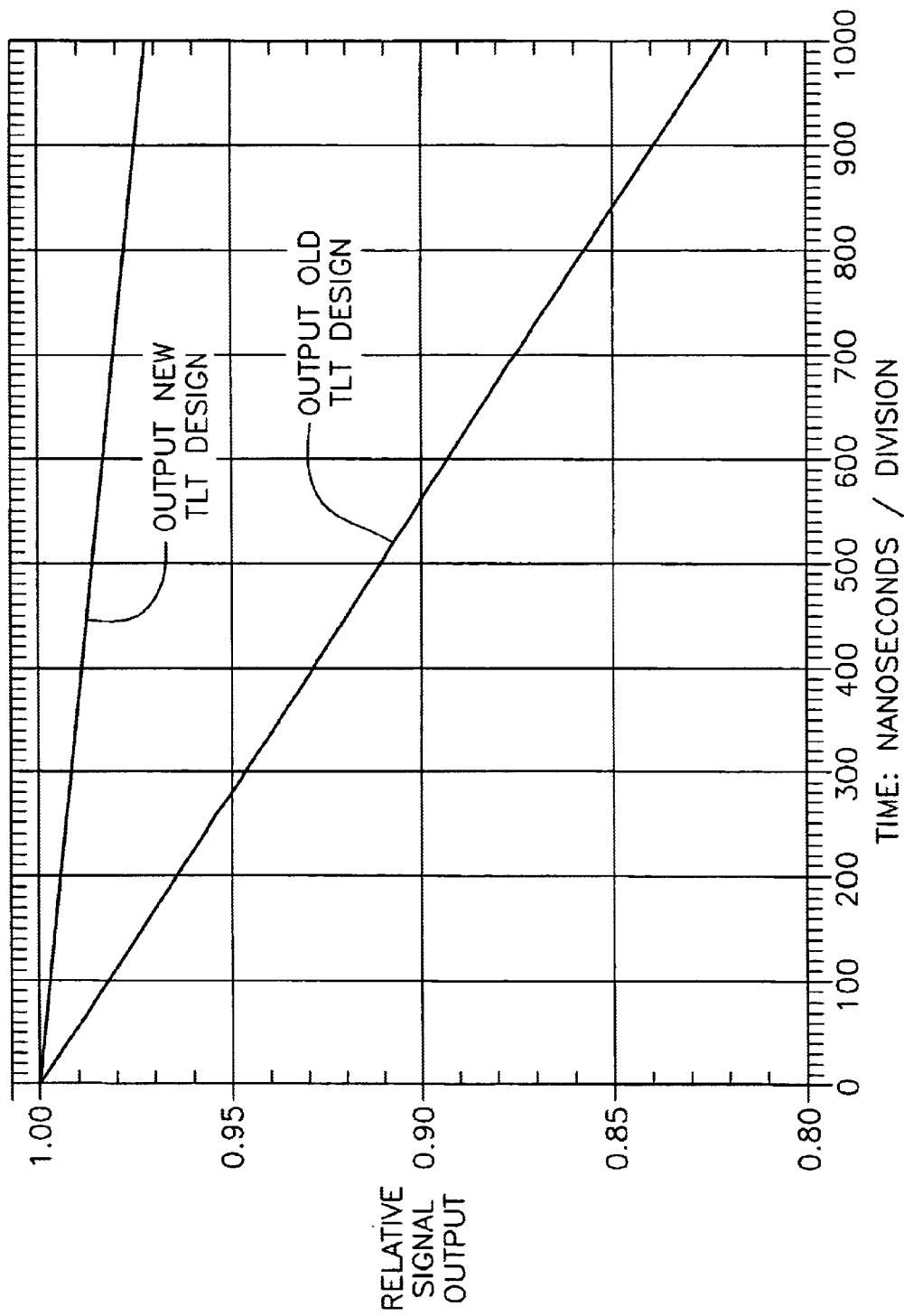
FIG. 10 is a graph showing STLT performance which uses proper turns schedule versus one that does not demonstrating efficiency of core usage.

Another benefit is that by properly winding the cable on a common core, with a definite turns schedule, the mutual inductance is maximized for the least amount of turns, resulting in more efficient use of the core, as well as less parasitic capacitive energy loss. Further the overall configuration of prior TLTs, tend to make the ferrite core part of the signal path resulting in the loss of fast edges in signal profiles as the magnetic fields in the core build-up and collapse. With reference to FIG. 10, there is a graph comparing signal droop (relative signal intensity) versus time illustrating this efficient use of the core. As shown the signal output for the STLT 30 according to the present invention maintains signal intensity over time compared to the TLT according to the prior art demonstrating fewer parasitic losses or propagation based upon magnetic field build-up and collapse. Thus the signals transmitted by the STLT according to the present invention have less droop and fast edges.

It has further been found that the STLT 30 according to the present invention is better suited than prior TLTs 10 according to the prior art. At particularly higher frequency regimes, wider bandwidths can be transmitted by the STLT 30. It is believed that, at the higher frequencies, the core 32 provides a high reactance to propagation of signals to and through the core 32, thus confining the signal path within the transmission lines and reducing if not eliminating inductive transmission and parasitic inductive losses.

Still further, the impedance ratios which can be provided by the STLT according to the present invention are not limited to low values but can easily achieve several orders or magnitude. This is an important feature for driving highly reactive loads like piezo transducers or magnetic heads, or by simply acting as a passive voltage or current amplifier.

Table 1 below sets forth a schedule for impedance ratios, line sets and turns:

TABLE I

Total Transmission Line Turns (times N) as a Function of Voltage Transform Ratio (Non-Inverting).

| Impedance Ratio | Voltage Ratio | TLT 10 | TLT 28 | Binary STLT | Trinary STLT |
|---|---|---|---|---|---|
| 4 | 2 | 1 | 1 | 1.5 | — |
| 9 | 3 | 3 | 3 | — | 3 |
| 16 | 4 | 6 | 5 | 4.5 | — |
| 36 | 6 | 15 | 11 | — | — |
| 25 | 5 | 10 | 8 | — | — |
| 49 | 7 | 21 | 15 | — | — |
| 64 | 8 | 28 | 19 | 10.5 | — |
| 81 | 9 | 36 | 24 | — | 12 |
| 100 | 10 | 45 | 29 | — | — |
| 256 | 16 | 120 | 71 | 22.5 | — |
| 729 | 27 | 351 | 195 | — | 39 |
| 1024 | 32 | 496 | 271 | 46.5 | — |
| $R^2$ | R | R(R−1)/2 | (R + 3) (R − 1)/4 | 3(R − 1)/2 | 3(R − 1)/2 |

($N=V_{in}/V_t$ where $V_{in}$ is the low end voltage and $V_t$ the fixed Volts/turn of the cables.)

The STLT according to the present invention can be constructed without the core 26; however low frequency bandwidth would be sacrificed. The core 26 may be replaced and/or supplemented by placing ferrite beads at each series junction to extend high frequency bandwidth.

Making tight series and parallel connections is also preferable to minimize inductance, and stray capacitive coupling.

The STLT 30 according to the present invention overcomes the drawbacks noted above in prior TLT design. The STLT provides for fast rise times in the range of 100 ps, has low signal droop, operates over a large bandwidth in the range of 1 kHz–18 GHz, is scalable and can be constructed for a very wide range of impedance ratios.

While we have shown certain embodiments of the present invention, it is to be understood that is subject to many modifications without departing from the spirit and scope of the appended claims.

We claim:

1. A series transmission line transformer comprising:
   input and output connections having a desired impedance relationship;
   a first set of at least two coiled transmission lines electrically connected in parallel at one end and in series at the other end;
   at least a second set of at least two coiled transmission lines connected in parallel on one end and in series on the other end, said first set of lines cascaded with the other sets, each impedance of a set matched to the next, said input and output connected to said first and last set of said cascade.

2. The transformer of claim 1 wherein each set has an impedance ratio substantially equal to $m^2$, where in is the number of transmission lines comprising that set.

3. The transformer of claim 2 wherein the total impedance ratio is the product of each set impedance ratio.

4. The transformer of claim 1 wherein all said sets are coiled about a common core of magnetic material.

5. The transformer of claim 1 having a desired voltage ratio $R=V_{hi}/V_{lo}$.

6. The transformer of claim 1 having a uniform voltage per turn $V_p$, and $N=V_{lo}/V_t$ is an integer.

7. The transformer of claim 1 wherein said lines of said sets are coiled a total number of turns T substantially equal to 3N(R−1)/2 where R is the voltage ratio of $V_{hi}/V_{lo}$, and having a uniform voltage per turn $V_p$, and $N=V_{lo}/V_t$ is an integer.

* * * * *